(12) United States Patent
Baumbach et al.

(10) Patent No.: US 8,094,562 B1
(45) Date of Patent: Jan. 10, 2012

(54) TRANSMISSION OF A CONTINUOUS DATASTREAM THROUGH A RE-CLOCKED FRAME-BASED TRANSPORT NETWORK

(75) Inventors: Jason Baumbach, San Jose, CA (US); Somnath Paul, Fremont, CA (US); Paul Scott, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1159 days.

(21) Appl. No.: 11/138,617

(22) Filed: May 26, 2005

Related U.S. Application Data (60) Provisional application No. 60/583,232, filed on Jun. 24, 2004.

(51) Int. Cl.
*H04L 12/26* (2006.01)
(52) U.S. Cl. ...................................................... 370/236
(58) Field of Classification Search .................. 370/229, 370/230, 230.1, 231, 235, 236, 241, 248, 370/249, 351, 352–357, 360, 389, 395.1, 370/395.5, 395.6–395.62, 400, 401, 412, 370/419–421, 428, 429; 375/354, 371–376; 327/100, 141, 144–148, 155–157
See application file for complete search history.

(56) References Cited

U.S. PATENT DOCUMENTS

| | | | |
|---|---|---|---|
| 4,787,097 A * | 11/1988 | Rizzo | 375/375 |
| 5,255,293 A * | 10/1993 | Archer et al. | 375/372 |
| 6,252,850 B1 * | 6/2001 | Lauret | 370/235 |
| 6,295,409 B1 * | 9/2001 | Ikeda | 386/125 |
| 6,341,313 B1 * | 1/2002 | Kanoh | 709/227 |
| 6,519,267 B1 * | 2/2003 | Sansom et al. | 370/523 |
| 6,826,151 B1 * | 11/2004 | Li et al. | 370/230.1 |
| 2003/0167425 A1 * | 9/2003 | Bader et al. | 714/100 |

FOREIGN PATENT DOCUMENTS
EP  1133128 A1 * 9/2001

\* cited by examiner

*Primary Examiner* — Derrick Ferris
*Assistant Examiner* — Omar Ghowrwal (57) ABSTRACT

A network interface to transport a continuous datastream over a frame-based transport network. The network interface includes a data input, an egress buffer circuit, a phase locked loop, and a data output. The data input receives frames carrying the continuous datastream from the frame-based transport network. The egress buffer circuit is coupled to buffer the continuous datastream and to generate a feedback signal based at least in part on a fill-level of the egress buffer. The phase locked loop is coupled to receive the feedback signal from the egress buffer and to recover a clock signal from the continuous datastream. The data output is coupled to output the data of the continuous datastream from the egress buffer circuit based on the clock signal.

13 Claims, 6 Drawing Sheets

FIG. 6 ns of the invention.

TRANSMISSION OF A CONTINUOUS DATASTREAM THROUGH A RE-CLOCKED FRAME-BASED TRANSPORT NETWORK

CROSS-REFERENCE TO RELATED APPLICATION

This application claims the benefit of U.S. Provisional Application No. 60/583,232, filed on Jun. 24, 2004, the contents of which are incorporated herein by reference.

TECHNICAL FIELD

This disclosure relates generally to data communication, and in particular but not exclusively, relates to communication of continuous datastreams.

BACKGROUND INFORMATION

The broad category of data communication may be broken down into two general types of datastreams—frame datastreams (e.g., packet datastreams or cell datastreams) and continuous datastreams. A frame datastream is one in which provision is usually made to insert or delete non-data filler frames between valid data frames. The non-data filler packets enable minor variances in clock frequencies at the boundaries of a transport network to be accommodated by insertion and/or deletion of the non-data filler packets in the event of underflow and/or overflow. In contrast, a device processing a continuous datastream has no opportunity to insert or delete non-data filler packets for rate-matching purposes because such non-data filler packets do not exist. In a continuous datastream, every bit has meaning and nothing can be added or deleted from the datastream. Example continuous datastreams include FM radio broadcasts, analog voice, unencoded music, CD audio output, analog video, NTSC television broadcasts, and the like.

Figure 1:
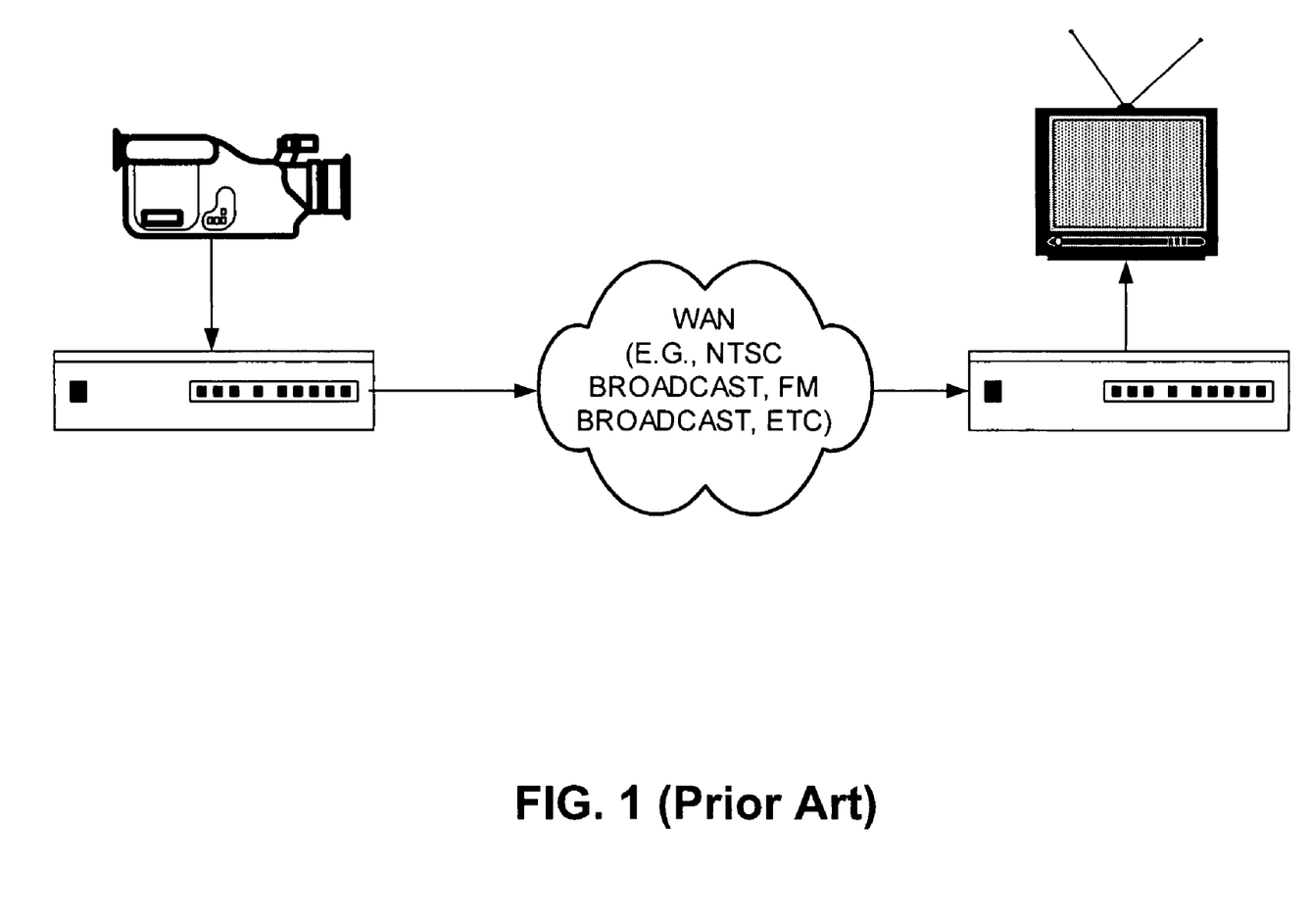
FIG. 1 illustrates transmission of a continuous datastream over a conventional non-frame based wide area network.

FIG. 1 illustrates transport of a continuous datastream (e.g., a video signal) across a wide area network ("WAN") using conventional techniques (e.g., NTSC broadcasting, etc.), not a frame based (e.g., packet switching or cell switching) network. The continuous datastream may be transported across a frame based network, if partial loss by periodically deleting portions of the continuous datastream is acceptable. However, known techniques do not provide a mechanism to transport a complete continuous datastream without loss over a frame-based transport network.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for transporting a continuous datastream over a frame-based re-clocked transport network are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. A "frame" is defined herein as a generic term to describe variable sized packets or fixed sized cells. Therefore, a "frame-based transport network" is defined herein to include both packet switching networks and cell switching networks. A "re-clocked frame-based transport network" is defined herein as a frame-based transport network which is clocked independent of a neighboring network or medium communicating over the frame-based transport network. A "continuous datastream" is defined herein as a stream of data synchronized to a clock wherein a data bit is present and meaningful during every cycle of the clock during the continuous datastream. A continuous datastream has no opportunity to add or delete non-data filler bits as such non-data filler bits would corrupt the logical meaning of the continuous datastream.

Figure 2:
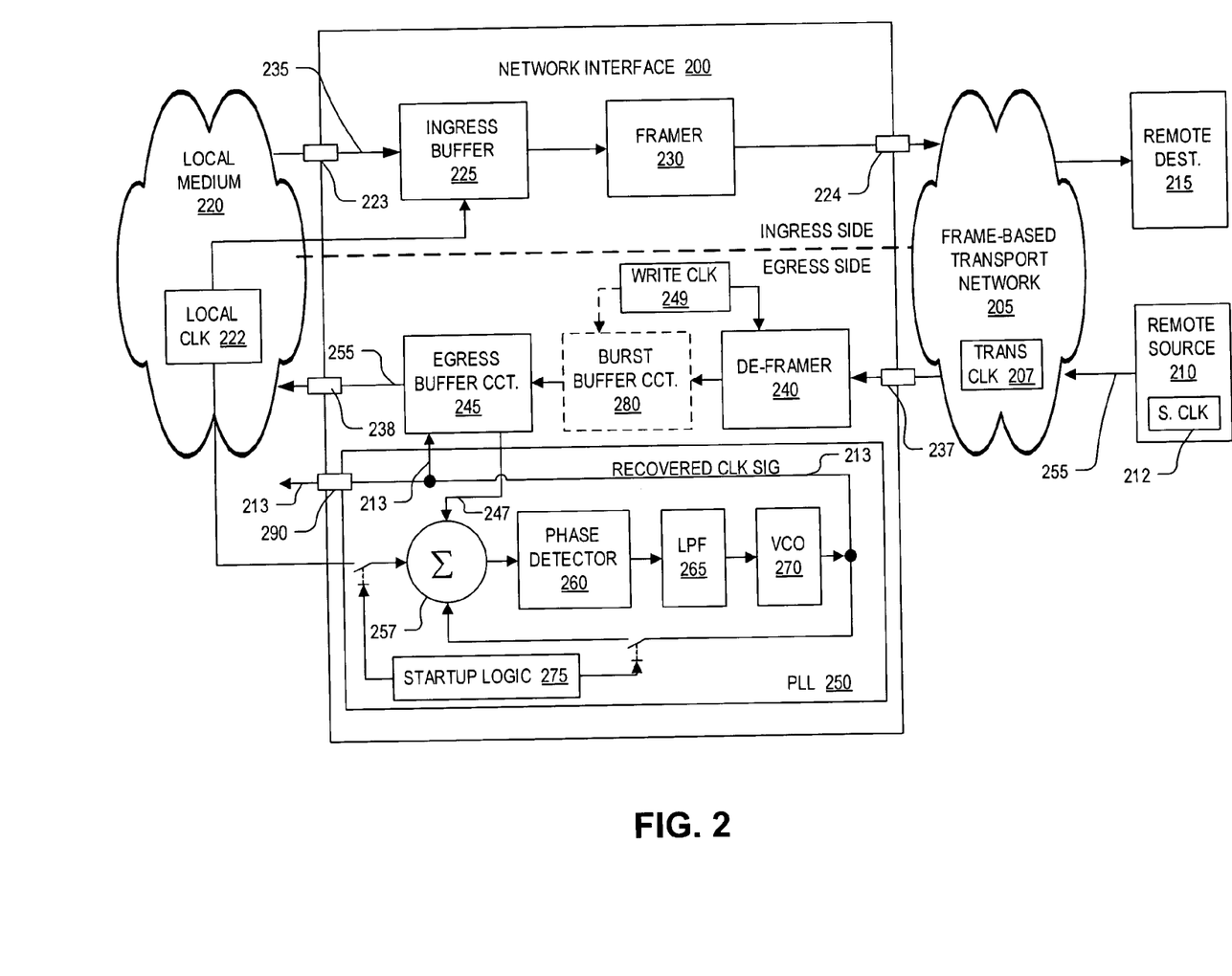
FIG. 2 is a block diagram illustrating an interface for transporting a continuous datastream over a re-clocked frame-based transport network, in accordance with an embodiment of the invention.

FIG. 2 is a block diagram illustrating a network interface 200 for transporting continuous datastreams over a re-clocked frame-based transport network 205 between a remote source 210 and destination 215 and a local medium 220, in accordance with an embodiment of the invention. The illustrated embodiment of network interface 200 includes an ingress side and an egress side. The ingress side includes a data input 223, a data output 224, an ingress buffer 225, and a framer 230. The ingress side transports an ingress continuous datastream 235 from local medium 220 over frame-based transport network 205 to remote destination 215. The egress side includes a data input 237, a data output 238, a de-framer 240, an egress buffer circuit 245, a write clock 249, and a phase locked loop ("PLL") 250. The egress side transports an egress continuous datastream 255 from remote source 210 over frame-based transport network 205 to local medium 220. The illustrated embodiment of PLL 250 includes a summation circuit 257, a phase detector 260, a low pass filter ("LPF") 265, a voltage controlled oscillator ("VCO") 270, and a startup circuit 275.

The egress side may optionally include one or more burst buffer circuits 280, indicated as optional by the dashed line. The designation of burst buffer circuit 280 as optional is not to indicate by implication that one or more of the other components of network interface 200 are not optional, but merely to emphasize that burst buffer circuit 280 is optional.

Embodiments of network interface 200 enable a continuous datastream (e.g., continuous datastream 255) clocked according to a source clock 212 to be segmented and transported over frame-based transport network 205 without loss. Frame-based transport network 205 may insert non-data filler frames to accommodate the clock domain boundary between source clock 212 and a transport clock 207 used to clock frame-based transport network 205 and to provide for transport overhead data. Embodiments of the invention enable the segmented continuous datastream 255 to be reassembled at the other end of frame-based transport network 205 by network interface 200 without loss and further to recover source clock 212 from continuous datastream 255 to re-clock the reassembled continuous datastream 255. Embodiments of the invention are capable to recover source clock 212 even though source clock 212 itself is not propagated through frame-based transport network 205 and even though frame-based transport network 205 may transport the segments of continuous datastream 205 synchronized to transport clock 207 independent of source clock 212.

Frame-based transport network 205 represents any packet switching or cell switching network, such as an Ethernet network, a gigabit Ethernet ("GbE") network, a Fibre Channel network, a Synchronous Optical Network ("SONET"), an Asynchronous Transfer Mode ("ATM") network, or the like. Frame-based transport network 205 is a re-clocked network because it is clocked independent of remote source 210 and local medium 220. FIG. 2 illustrates the components of network interface 200 as functional blocks which may be executed in software on a network device communicatively coupled to frame-based transport network 205 or implemented in hardware, such as in connection with a network physical-layer device ("network PHY"), a link-layer device, or the like. Local medium 220 represents any device or network coupled to transport continuous datastreams 235 and 255 over frame-based transport network 205. For example, local medium 220 may represent a computer communicatively coupled to frame-based transport network 205, while network interface 200 represents a network interface of the computer. Alternatively, local medium 220 may represent a non-frame based network or communication channel for communication continues datastreams and network interface 200 acts as a bridge between the non-frame based network/channel and frame-based transport network 205.

The ingress side of network interface 200 operates as follows. Ingress continuous datastream 235 is received at data input 223 and written into ingress buffer 225 synchronous to a local clock 222. Ingress buffer 225 temporarily buffers ingress continuous datastream 235. In one embodiment, ingress buffer 225 is a first-in-first-out ("FIFO") buffer. Framer 230 reads out continuous datastream 235 from ingress buffer 225, segments continuous datastream 235, packages the segments into frames (e.g., packets or cells), and forwards the frames carrying segments of continuous datastream 235 to frame-based transport network 205 for transport to remote destination 215. In other words, framer 230 converts the continuous datastream 235 into discrete frames for transmission over frame-based transport network 205. Framer 230 acts as a protocol-mapping engine to frame data segments of continuous datastream 235 using a protocol, such as high-level data-link control ("HDLC"), generic framing procedure ("GFP"), or the like. In one embodiment, framer 230 is a re-clocked element that is clocked by transport clock 207 of frame-based transport network 205. Therefore, framer 230 reads continuous datastream 235 out of ingress buffer 225 according to transport clock 207. Accordingly, ingress buffer 225 provides a transitional buffer between two independent clock domain boundaries.

Transport of data between two independent clock domains introduces a number of issues, which can result in overflow (receiving more data before the processing of the earlier data is complete) or underflow (not receiving data when required). Even if the nominal rates (e.g., 62.5 MHz for GbE) between two independently clocked networks are equivalent, the average frequency will vary due to allowed tolerances in communication specifications (e.g., 62.5 MHz±100 ppm for GbE), thermal and fabrication variances, and the like, and due to separate networks having independent clock sources. Therefore, over time no matter how small the mismatch, overflow and/or underflow will occur. To compensate, frame-based networks insert and/or delete non-data filler frames (also referred to as "idle characters" or "idle frames") when needed. However, direct insertion of non-data filler frames into a continuous datastream without loss of timing and meaning is not possible for the reasons discussed above. Accordingly, network interface 200 converts ingress continuous datastream 235 into a stream of frames after which non-data filler frames may be inserted to compensate for the clock domain boundary between local medium 220 and frame-based transport network 205. To ensure no portion of continuous datastream 235 is lost due to overflow at ingress buffer 225, frame-based transport network 205 is an oversubscribed transport network (e.g., the frame-based transport network may support a 1.2 Gbps rate while local medium 220 outputs continuous datastream 235 at a maximum rate of 1.0 Gbps) capable of transporting a greater data rate than local medium 220 will send to it. Therefore, framer 230 will never be in an overflow position, but may regularly insert non-data filler frames due to underflow.

However, conversion of continuous datastream 235 into a stream of frames, which may result in interleaving non-data filler frames, eliminates synchronicity between the continuous datastream 235 and its local clock 222. Furthermore, since frame-based transport network 205 does not propagate local clock 222, local clock 222 needs to be recovered and the idle characters or filler data removed at remote destination 215 to reassemble continuous datastream 235.

The egress side of network interface 200 operates as follows to address these reassembly issues. Remote source 210 transmits a continuous datastream 255 clocked according to a source clock 212. Continuous datastream 255 is converted into a stream of frames for transport across re-clocked frame-based transport network 205 as described above. The frames arriving at data input 237 are provided to de-framer 240. In one embodiment, de-framer 240 is clocked by transport clock 207 to receive the frames synchronous with frame-based transport network 205. De-framer 240 strips the header and/or footer information from each frame to liberate its payload (e.g., segments of continuous datastream 255). De-framer 240 acts as a transport protocol de-mapping engine. In embodiment, de-framer 240 writes the segments of continuous datastream 255 directly into egress buffer circuit 245 synchronized to a write clock 249. In one embodiment, write clock 249 is equivalent to transport clock 207.

In an alternative embodiment, burst buffer circuit 280 is included between de-framer 240 and egress buffer circuit 245. In this embodiment, de-framer 240 receives the frames, extracts the payload information containing continuous datastream 255, and writes the segments of continuous datastream 255 into burst buffer circuit 280, all synchronously with transport clock 207. Based on the traffic patterns of frame-based transport network 205, the frames may arrive at de-framer 240 with a bursty traffic profile. Accordingly, burst buffer circuit 280 provides a mechanism to temporally smooth bursty arrival of the segments of continuous datastream 255. Subsequently, burst buffer circuit 280 writes the segments of continuous datastream 255 into egress buffer circuit 245 synchronized to write clock 249. In one embodiment, burst buffer circuit 280 is a FIFO buffer. Write clock 249 may be an independent clock to transport clock 207, may be transport clock 207 itself, a scaled version of transport clock 207 (e.g., multiplied or divided version of transport clock 207), or otherwise.

As continuous datastream 255 is written into egress buffer circuit 245, egress buffer circuit 245 fills and commences to generate a feedback signal 247 based on a fill-level of egress buffer circuit 245. In one embodiment, egress buffer circuit 245 includes a FIFO buffer and feedback logic for monitoring the fill-level of the FIFO buffer and generating feedback signal 247. Feedback signal 247 acts as a measure of the average data rate of continuous datastream 255 arriving at egress buffer circuit 245. By definition, the average data rate of continuous datastream 255 is equivalent to source clock 212 and therefore source clock 212 can be recovered based on feedback signal 247. Feedback signal 247 is provided to PLL 250 to generate recovered clock signal 213. In turn, recovered clock signal 213 is provided to egress buffer circuit 245 as a read clock for reading out continuous datastream 255 to data output 238.

PLL 250 acts to generate recovered clock signal 213 as follows. Feedback signal 247 is summed with recovered clock signal 213 by summation circuit 257. Summation circuit 257 generates a sum signal of feedback signal 247 and recovered clock signal 213 which is provided to phase detector 260. Phase detector 260 generates an error signal based on the sum signal. The error signal is indicative of the phase difference between feedback signal 247 and recovered clock signal 213. The error signal is then low pass filtered by LPF 265 to remove higher order harmonics. In response, VCO 270 oscillates at a selected frequency to generate recovered clock signal 213.

During an initial startup phase, PLL 250 will not have acquired a lock on source clock 212 and therefore recovered clock signal 213 will have some initial error. This initial startup phase may be referred to as a transient phase of PLL 250. Once PLL 250 does acquire a lock the transient phase gives way to a steady state phase where recovered clock signal 213 tracks source clock 212 within specified tolerances. To hasten the transient phase, PLL 250 may include startup logic 275. During the transient phase, startup logic 275 selectively couples a local clock (e.g., local clock 222 or other clock) into summation circuit 257 and decouples the output of VCO 270. Temporarily coupling local clock 222 initiates PLL 250 at a frequency which is close to source clock 212 and therefore accelerates phase lock and shortens the transient phase. Subsequently, startup logic 275 selectively decouples local clock 222 from summation circuit 257 and couples the output of VCO 270 to summation circuit 257 to enable final phase lock and enter the steady state phase of operation.

Feedback signal 247 may be generated in a variety of manners. In one embodiment, feedback signal 247 is a binary bit flag which is set and cleared each time the fill-level of egress buffer circuit 245 passes over a threshold fill-level. In one embodiment, the threshold fill-level is a half-full fill-level, though other fill-levels may be used (e.g., one third full, two thirds full, etc.). In one embodiment, feedback signal 247 is triggered by a series of fill-level thresholds. As each of the fill-level thresholds are exceeded, a different feedback signal 247 may be toggled. Alternatively, in this multi fill-level threshold embodiment, feedback signal 247 may be a multi-bit signal where each bit corresponds to one of the fill-level thresholds or where each value of the multi-bit signal corresponds to one of the fill-level thresholds. As the fill-level drops back below each fill-level threshold, feedback signal 247 is again toggled accordingly. In one embodiment, feedback signal 247 is generated based on a continuously monitored fill-level of egress buffer circuit 245. In yet another embodiment, feedback signal 247 may be generated based in part on the fill-level of egress buffer circuit 245 and based in part on the traffic profile or burstiness of frame-based transport network 205. In yet another embodiment, feedback signal 247 may be based in part on an accumulated deviation or running disparity-like scheme. For example, for every cycle of recovered clock signal 213 that feedback signal 247 is set, add one to an accumulator, and for every cycle of recovered clock signal 213 that feedback signal 247 is cleared, subtract one from the accumulator. Then, use the accumulated deviation as feedback to more aggressively or more loosely control VCO 270. Other techniques for generating feedback signal 247 based at least in part on the fill-level of egress buffer circuit 245 may also be implemented.

In one embodiment, in order to ensure that feedback signal 247 transitions at a rate high enough to provide meaningful input to PLL 250, the size of an individual write into egress buffer circuit 245 is twice the size of an individual read out of egress buffer circuit 245. This provides the highest transition rate of feedback signal 247 and therefore the greatest update frequency to PLL 250. If the size of an individual write into egress buffer circuit 245 is the same as the size of an individual read from egress buffer circuit 245, then feedback signal 247 would transition at a low rate. For example, if VCO 270 is operating at 50.000 MHz and de-framer 240 (or burst buffer circuit 280) is writing into egress buffer circuit 245 at 50.001 MHz, then the beat frequency is approximately 0.001 MHz. A beat frequency of 0.001 MHz is much too low as an update frequency to PLL 250.

Figure 3A:
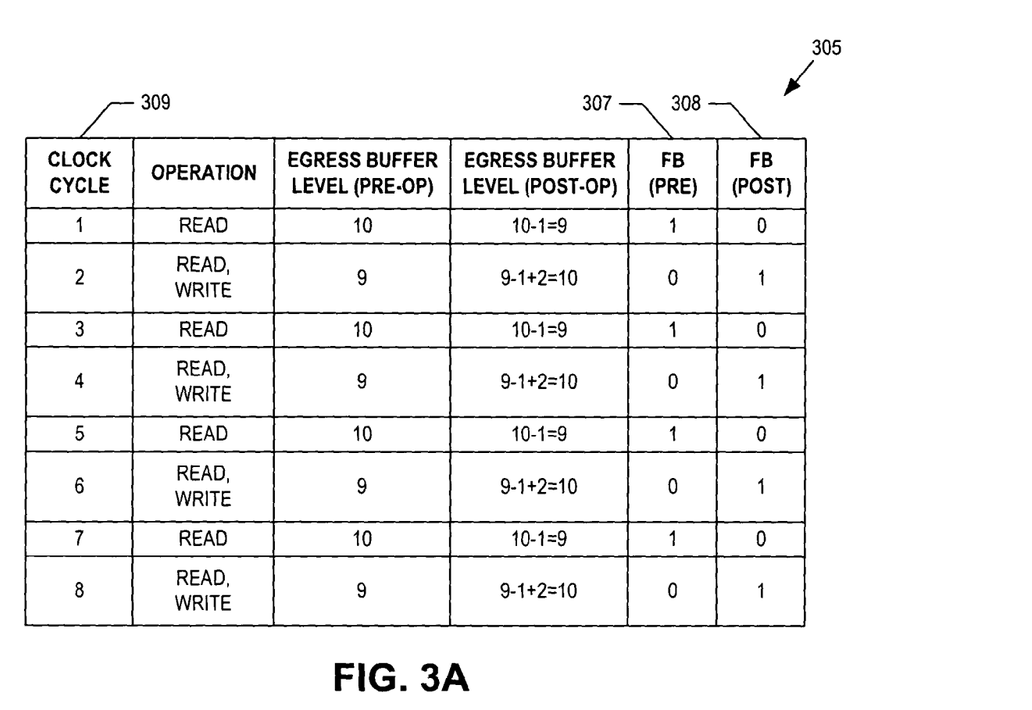
FIG. 3A is a table illustrating transitions of a feedback signal where a write rate to an egress buffer circuit is half that of a read rate from the egress buffer circuit, in accordance with an embodiment of the invention.

FIG. 3A is a table 305 illustrating transitions of feedback signal 247 where the write rate to egress buffer circuit 245 is half that of the read rate from egress buffer circuit 245, in accordance with an embodiment of the invention. Of course, if the write rate is half the read rate, then the individual size of each write into egress buffer circuit 245 is twice the individual size of each read from egress buffer circuit 245. In table 305, the fill-level threshold is between a fill-level of 9 and 10. As illustrated in table 305, the frequency of feedback signal 245 (illustrated in columns 307 and 308) is half the recovered clock signal 213 (illustrated in column 309). Continuing the example above, if VCO 270 is operating at 50.000 MHz and de-framer 240 (or burst buffer circuit 280) is writing into egress buffer circuit 245 at 25 MHz, then the beat frequency is approximately 25 MHz, which provides considerably better feedback control than 0.001 MHz.

Figure 3B:
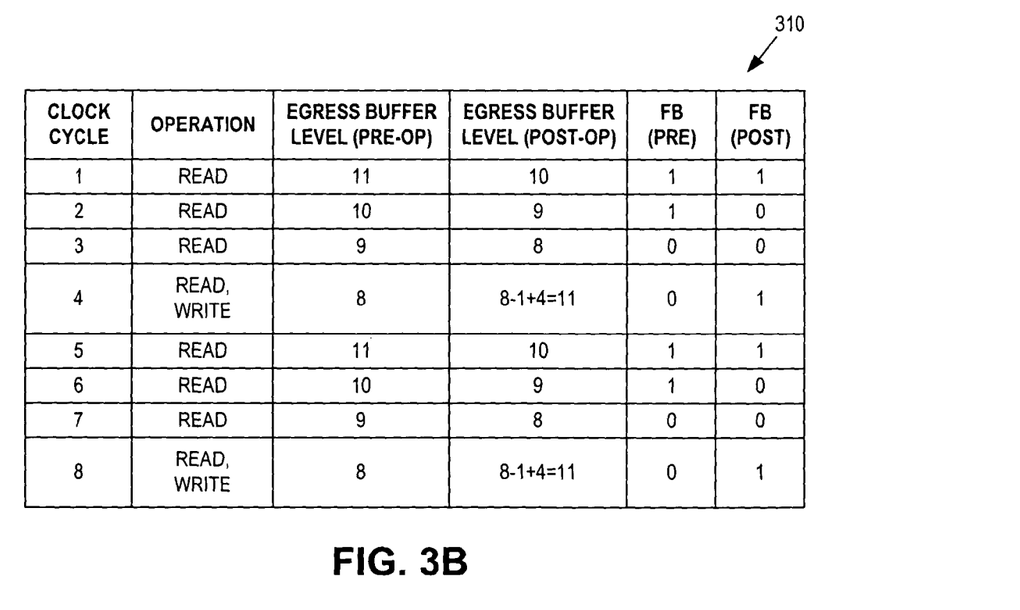
FIG. 3B is a table illustrating transitions of a feedback signal where a write rate to an egress buffer circuit is one quarter that of a read rate from the egress buffer circuit, in accordance with an embodiment of the invention.

FIG. 3B is a table 310 illustrating transitions of feedback signal 247 where a write rate into egress buffer circuit 245 is one quarter that of a read rate from egress buffer circuit 245, in accordance with an embodiment of the invention. As illustrated, when the write rate is less than half the read rate, then the update frequency of feedback signal 247 decreases. Continuing the example above, but with the modification that the write rate is one quarter the read rate, the beat frequency decrease to approximately 12.5 MHz. Accordingly, the read/write constraints where the write rate is half the read rate and the individual write size is twice the individual read size provides the highest update frequency.

Figure 4A:
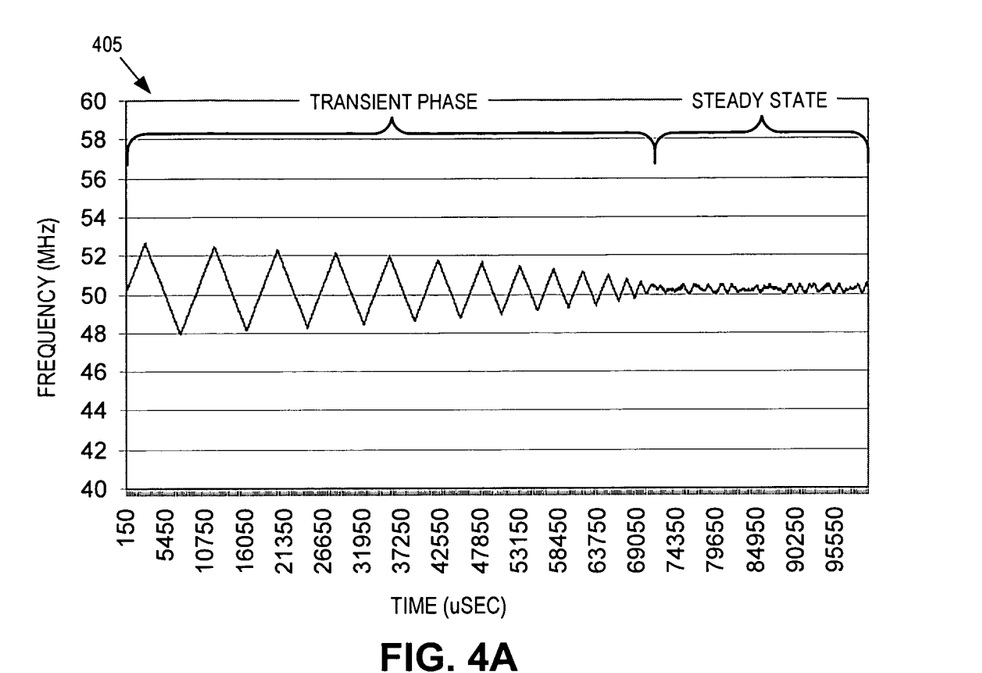
FIG. 4A is a line graph illustrating simulation results of a transient phase and a steady state phase of a phase lock loop as it acquires a lock onto a remotely located source clock through a re-clocked frame-based transport network, in accordance with an embodiment of the invention.

FIG. 4A is a line graph 405 illustrating simulation results of the transient and steady state phases of PLL 250 as it acquires a lock onto source clock 212, in accordance with an embodiment of the invention. As illustrated by line graph 405, recovered clock signal 213 can be seen to settle close to the nominal frequency of source clock 212, illustrated as a little above 50 MHz. It should be appreciated that line graph 405 indicates the simulation performance of an example implementation of the invention and should not be interpreted as describing the maximum performance potential of embodiments of the invention.

A number of design tweaks may be implemented to shorten the transient phase and decrease the frequency jitter in the steady state phase. For example, jitter during the steady state phase may be reduced by decreasing the charge pump current of VCO 270 over time after the steady state phase has been reached or the charge pump may even be temporarily disabled during the steady state phase. The transient phase may be shortened by increasing the charge pump current during this phase to reduce PLL lock time, the maximum frequency excursion of VCO 270 may be restricted by comparison to a reference clock, or the charge pump current may be varied according to frequency.

Figure 4B:
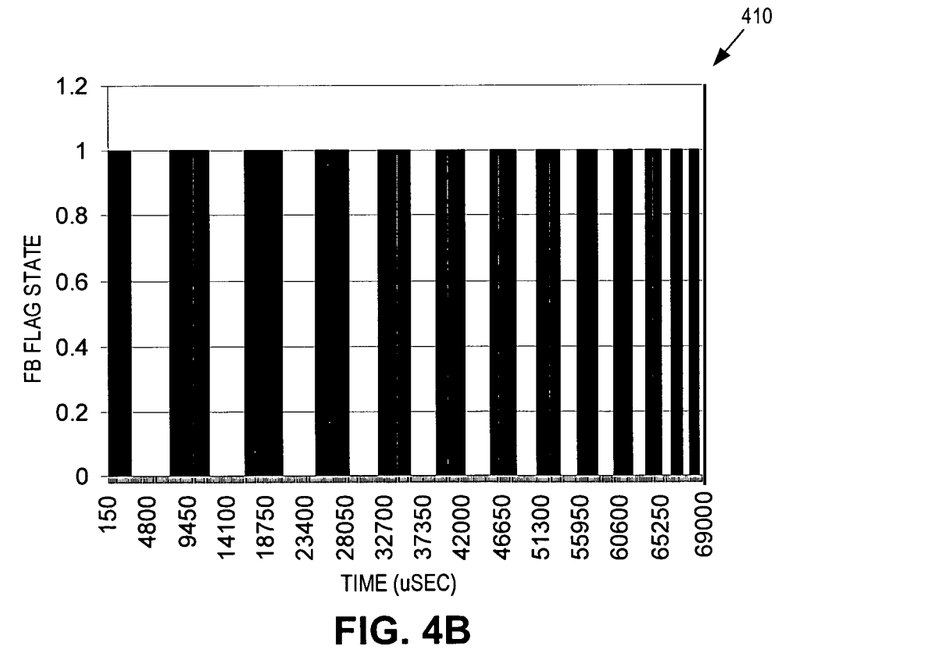
FIG. 4B is a graph illustrating transitions of a feedback signal for locking onto a remotely located source clock through a re-clocked frame-based transport network, in accordance with an embodiment of the invention.

FIG. 4B is a graph 410 illustrating transitions of feedback signal 247 as PLL 250 locks onto source clock 212, in accordance with an embodiment of the invention. FIG. 4B illustrates transitions of a binary bit flag embodiment of feedback signal 247. As illustrated, the toggling frequency of the binary bit flag increases as PLL 250 approaches the steady state phase.

Figure 5:
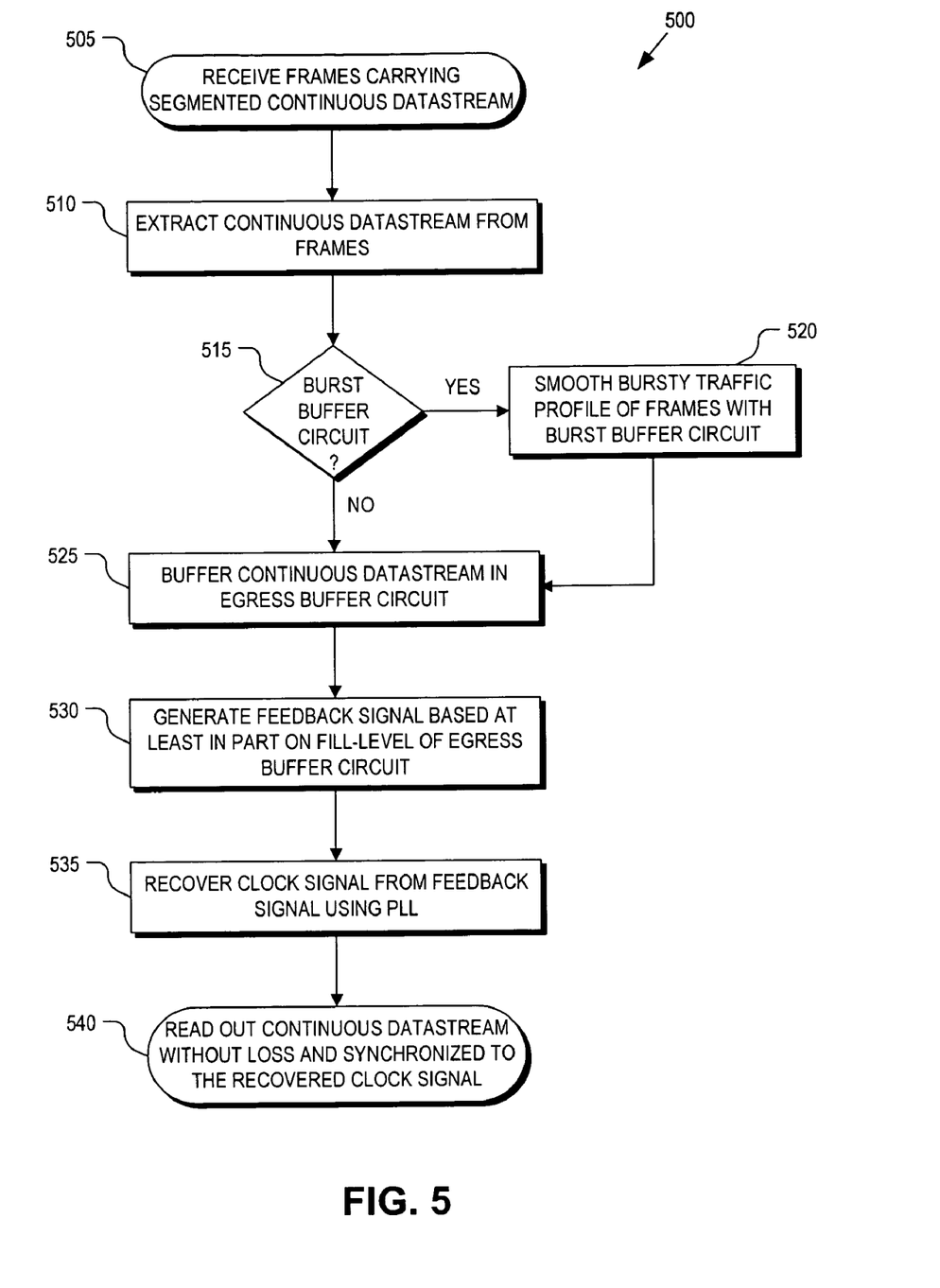
FIG. 5 is a flow chart illustrating a process for operating a network interface to receive a continuous datastream over a re-clocked frame-based transport network, in accordance with an embodiment of the invention.

FIG. 5 is a flow chart illustrating a process 500 for operating the egress side of network interface 200 to receive continuous datastream 255 over re-clocked frame-based transport network 205, in accordance with an embodiment of the invention. Process 500 is described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like. The order in which some or all of the process blocks appear in each process should not be deemed limiting. Rather, one of ordinary skill in the art having the benefit of the present disclosure will understand that some of the process blocks may be executed in a variety of orders not illustrated.

In a process block 505, frames carrying the segmented portions of continuous datastream 255 are received at data input 237. In a process block 510, de-framer extracts continuous datastream 255 from the received frames. If network interface 200 includes burst buffer circuit 280 (decision block 515), then de-framer 240 writes the extracted segments of continuous datastream 255 into burst buffer circuit 280 (process block 520).

Burst buffer circuit 280 may receive portions of continuous datastream 255 in a bursty manner. In a process block 525, burst buffer circuit 280 writes portions of datastream 255 into egress buffer circuit 245 with a more consistent and less bursty profile synchronized to write clock 249. Accordingly, burst buffer circuit 280 should be sufficiently deep to accommodate periodic large bursts from frame-based transport network 205 and de-framer 240. The rate and profile at which frames are received from frame-based transport network 205 may depend upon characteristics of the transport protocol used to send the frames, provisioning of frame-based transport network 205, a channel assignment of de-framer 240, as well as other variables. In one embodiment, burst buffer circuit 280 may be random access memory ("RAM") externally coupled to network interface 200. In an embodiment not including burst buffer circuit 280 (decision block 515), de-framer may include an internal burst buffer circuit to accommodate periodic large bursts from frame-based transport network 205 and therefore write directly from its internal burst buffer into egress buffer circuit 245 (process block 525).

In a process block 530, as egress buffer circuit 245 fills with continuous datastream 255, feedback signal 247 is generated based at least in part on the fill-level as a measure of the average data rate of continuous datastream 255. In a process block 535, the remotely located source clock 212 is recovered from feedback signal 247 using PLL 250. In a process block 540, continuous datastream 255 is read out from egress buffer circuit 245 without loss, without the presence of non-data filler characters, and synchronized to recovered clock signal 213. In one embodiment, recovered clock signal 213 may also be output from a clock output 290 (see FIG. 2) to clock an attached local device (e.g., local medium 220).

Figure 6:
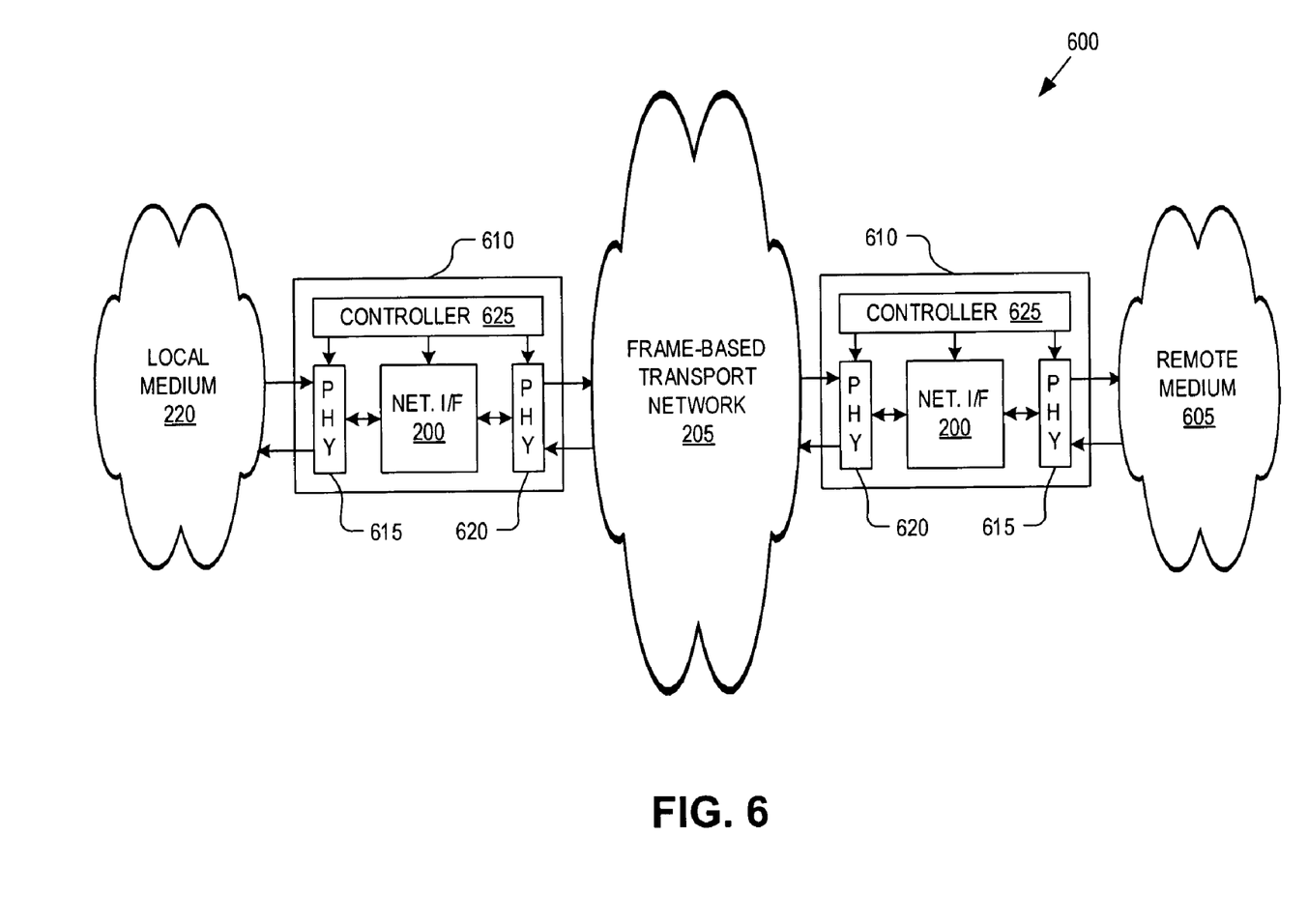
FIG. 6 is a block diagram illustrating a system for transporting a continuous datastream over a re-clocked frame-based transport network, in accordance with an embodiment of the invention.

FIG. 6 is a block diagram illustrating a system 600 for transporting a continuous datastream over re-clocked frame-based transport network 205, in accordance with an embodiment of the invention. The illustrated embodiment of system 600 includes remote media 220 and 605, frame-based transport network 205, and interface devices 610. The illustrated embodiments of interfaces devices 610 each include network interface 200, a local media PHY device 615, a transport network PHY device 620, and a controller 625. PHY devices 615 provide the physical layer attachment to local media 220 and 610 (e.g., professional video equipment, professional audio equipment, local area networks, local communication channels, computers, networking devices, etc.), while transport network PHY devices 620 provide the physical layer attachment to frame-based transport network 205. In one embodiment, controllers 625 are control processors for operating control software to manage the components of interface devices 610.

Interface devices 610 each use network interface 200 to enable transport of continuous datastreams between local medium 220 and remote medium 605 over frame-based transport network 205. Frame-based transport network 205 may be a wide area network ("WAN") enabling transport of continuous datastreams over vast distances. Frame-based transport network 205 is a re-clocked network in that the transport clock of frame-based transport network 205 is independent of the clock used by local medium 220 and remote medium 605 to time the continuous datastreams. System 600 is well suited for long distance transmission of audio/video type continuous datastreams, such as the Society of Motion Picture and Television Engineers ("SMPTE") 292M video format, as well as others.

Although interfaces devices 610 are illustrated as full duplex devices both capable of bi-directional communication of continuous datastreams, embodiments of interfaces devices 610 (and network interfaces 200) may only support half-duplex or uni-directional communication. For example, interface device 610 coupled between local medium 220 and frame-based transport network 205 may only include the ingress side components of network interface 200, while interface device 610 coupled between remote medium 605 and frame-based transport network 205 may only include the egress side components of network interface 200 or vice versa.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
a data input to receive frames carrying a continuous datastream from a frame-based transport network;
an egress buffer circuit configured to buffer the continuous datastream and to generate a feedback signal based at least in part on a fill-level of the egress buffer circuit;
a phase locked loop ("PLL") coupled to receive the feedback signal from the egress buffer circuit and to determine a clock signal from the continuous datastream;
a de-framer coupled between the data input and the egress buffer circuit, the de-framer configured to extract the continuous datastream from the frames, wherein the de-framer is configured to be clocked by a transport clock of the frame-based transport network independent of the clock signal of the continuous datastream received by the de-framer; and
a data output configured to output data of the continuous datastream from the egress buffer circuit based on the clock signal,
wherein the PLL is configured to generate the clock signal to read out the continuous datastream from the egress buffer circuit at an average read rate approximately twice an average write rate at which the continuous datastream is to be written into the egress buffer circuit while an average read size of each read operation from the egress buffer circuit is approximately half an average write size of each write operation into the egress buffer circuit,
wherein the PLL is configured to decrease an associated charge pump current to reduce jitter in a steady state phase; and
wherein the PLL comprises:
a summation circuit coupled to generate a sum of the feedback signal and the clock signal;
a phase detector coupled to the summation circuit to generate an error signal indicative of a phase difference between the feedback signal and the clock signal;
a low pass filter coupled to filter the error signal; and
a voltage controlled oscillator ("VCO") coupled to generate the clock signal responsive to the error signal; and
the apparatus further comprising startup logic coupled to selectively couple either the clock signal from the VCO or a local clock signal into the summation circuit, the startup logic to temporarily couple the local clock signal into the summation circuit to initially synchronize the PLL.

2. The apparatus of claim 1, further comprising a burst buffer circuit coupled between the de-framer and the egress buffer circuit, the burst buffer circuit coupled to temporally smooth bursts of the continuous datastream received from the de-framer prior to providing the continuous datastream to the egress buffer circuit.

3. The apparatus of claim 1, wherein the frames comprise egress frames and the continuous datastream comprises an egress continuous datastream, and further comprising:
an ingress buffer to receive an ingress continuous datastream from a local medium and to buffer the ingress datastream; and
a framer coupled to segment the ingress datastream into ingress frames for transport across the frame-based transport network, wherein the ingress buffer is to be clocked by a local clock sourcing the ingress continuous datastream and the framer is to be clocked by a transport clock of the frame-based transport network independent of the local clock.

4. The apparatus of claim 1, wherein the egress buffer circuit includes logic to transition the feedback signal each time a fill threshold of the egress buffer circuit is exceeded.

5. The apparatus of claim 1, wherein the apparatus comprises a video transmitter, including:
a first physical-layer ("PHY") device coupled to the data input, the first PHY device to receive the frames from the frame-based transport network and to provide the frame to the data input; and
a second PHY device coupled to the data output, the second PHY device to receive the continuous datastream from the data output and provide the continuous datastream to a video receiving device.

6. A method, comprising:
buffering a continuous datastream received from a frame-based transport network within an egress buffer circuit by writing the continuous datastream into the egress buffer circuit at an average write rate with each write operation having an average write size, wherein the frame-based transport network comprises a re-clocked frame-based transport network clocked independently of the continuous datastream;
generating a feedback signal based at least in part on a fill-level of the egress buffer circuit as a measure of an average data rate of the continuous datastream;
determining a clock signal of the continuous datastream from the feedback signal;
decreasing an associated charge pump current to reduce jitter in a steady state phase;
reading out the continuous datastream from the egress buffer circuit synchronized to the clock signal, wherein the continuous datastream is read out at an average read rate approximately twice the average write rate with each read operation having an average read size approximately equal to half the average write size; and a phase locked loop ("PLL") comprising:
- a summation circuit coupled for generating a sum of the feedback signal and the clock signal;
- a phase detector coupled to the summation circuit for generating an error signal indicative of a phase difference between the feedback signal and the clock signal;
- a low pass filter coupled for filtering the error signal; and
- a voltage controlled oscillator ("VCO") coupled for generating the clock signal responsive to the error signal; and
- the method further comprising startup logic coupled for selectively coupling either the clock signal from the VCO or a local clock signal into the summation circuit, the startup logic temporarily coupling the local clock signal into the summation circuit to initially synchronize the PLL.

7. The method of claim 6, wherein reading out the continuous datastream from the egress buffer circuit comprises reading out the continuous datastream from the egress buffer circuit without inserting non-data filler and without deleting portions of the continuous datastream to compensate for a clock domain boundary between the re-clocked frame-based transport network and a local medium clocked according to the clock signal of the continuous datastream.

8. The method of claim 6, wherein buffering the continuous datastream within the egress buffer circuit comprises writing to a first-in-first-out ("FIFO") buffer at a write frequency approximately equal to half a read frequency of reading out the continuous datastream.

9. The method of claim 6, wherein generating the feedback signal comprises generating a binary feedback flag triggered each time at least one threshold fill-level of the egress buffer circuit is exceeded.

10. The method of claim 6, wherein generating the feedback signal comprises generating a continuous feedback of the fill-level of the egress buffer circuit.

11. The method of claim 6, wherein generating the feedback signal further comprises generating the feedback signal based at least in part on a traffic burst pattern of the frame-based transport network.

12. A network interface, comprising:
- means for buffering a continuous datastream received from a re-clocked frame-based transport network clocked independent of the continuous datastream;
- means for generating a signal indicative of a fill-level of the means for buffering as a measure of an average data rate of the continuous datastream;
- means for determining a clock signal of the continuous datastream based on the signal indicative of the fill-level of the means for buffering;
- a voltage controlled oscillator ("VCO") for decreasing an associated charge pump current to reduce jitter in a steady state phase; and
- a phase locked loop ("PLL") comprising:
- a summation circuit coupled for generating a sum of the signal and the clock signal;
- a phase detector coupled to the summation circuit for generating an error signal indicative of a phase difference between the signal and the clock signal;
- a low pass filter coupled for filtering the error signal; and
- the VCO coupled for generating the clock signal responsive to the error signal; and
- the network interface further comprising startup logic coupled for selectively coupling either the clock signal from the VCO or a local clock signal into the summation circuit, the startup logic temporarily coupling the local clock signal into the summation circuit to initially synchronize the PLL;
- wherein the means for buffering is configured to write-in the continuous datastream at an average write frequency with each write-in having an average write size and to read-out the continuous datastream at an average read frequency approximately twice the average write frequency with each read-out having an average read size approximately half the average write size.

13. The network interface of claim 12, wherein the means for buffering is configured to read-out the continuous datastream synchronized to the clock signal received from the means for determining.

* * * * *